United States Patent
Bennett et al.

(10) Patent No.: US 6,478,918 B2
(45) Date of Patent: Nov. 12, 2002

(54) SEMICONDUCTOR WAFER PROCESSING TAPES

(75) Inventors: Richard E. Bennett, Hudson, WI (US); Louis E. Winslow, Stillwater, MN (US); Greggory S. Bennett, Hudson, WI (US); Karunasena A. Alahapperuma, Woodbury, MN (US); Cheryl L. Moore, Afton, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 127 days.

(21) Appl. No.: 09/765,230

(22) Filed: Jan. 18, 2001

(65) Prior Publication Data

US 2001/0016257 A1 Aug. 23, 2001

Related U.S. Application Data

(62) Division of application No. 09/050,476, filed on Mar. 30, 1998, now Pat. No. 6,235,387.

(51) Int. Cl.$^7$ ............................................. H01L 21/784
(52) U.S. Cl. .................... 156/248; 156/247; 156/273.3; 156/275.5; 428/345; 438/464
(58) Field of Search ................................. 156/247, 248, 156/273.3, 275.5; 428/343, 345, 355 RA, 355 AC; 438/464

(56) References Cited

U.S. PATENT DOCUMENTS

| | | |
|---|---|---|
| 4,312,916 A | 1/1982 | Kakaumaru et al. |
| 4,379,201 A | 4/1983 | Heilmann et al. |
| 4,720,317 A | 1/1988 | Kuroda et al. |
| 4,737,559 A | 4/1988 | Kellen et al. |
| 4,756,968 A | 7/1988 | Ebe et al. |
| 4,818,621 A | 4/1989 | Kuroda et al. |
| 4,853,286 A | 8/1989 | Narimatsu et al. |
| 4,965,127 A | 10/1990 | Ebe et al. |
| 5,073,611 A | 12/1991 | Rehmer et al. |
| 5,085,655 A | 2/1992 | Mann et al. |
| 5,110,388 A | 5/1992 | Komiyama et al. |
| 5,126,178 A | 6/1992 | Takemura et al. |
| 5,149,586 A | 9/1992 | Ishiwata et al. |
| 5,183,699 A | 2/1993 | Takemura et al. |
| 5,187,007 A | 2/1993 | Ebe et al. |
| 5,290,615 A | 3/1994 | Tushaus et al. |
| 5,304,418 A | 4/1994 | Akada et al. |
| 5,424,122 A | 6/1995 | Crandall et al. |
| 5,506,279 A | 4/1996 | Babu et al. |
| 5,525,422 A | 6/1996 | Spies et al. |
| 5,538,771 A * | 7/1996 | Nakayama et al. ..... 428/345 X |
| 5,851,664 A * | 12/1998 | Bennett et al. |
| 5,942,578 A * | 8/1999 | Noguchi et al. |
| 6,040,048 A * | 3/2000 | Kato et al. .................. 428/345 |
| 6,235,387 B1 * | 5/2001 | Bennett et al. ........ 428/355 AC |
| 6,273,791 B1 * | 8/2001 | Kataoka et al. |
| 6,297,076 B1 * | 10/2001 | Amagi et al. ............... 438/114 |
| 6,312,800 B1 * | 11/2001 | Noguchi et al. ......... 428/343 X |

FOREIGN PATENT DOCUMENTS

| | | |
|---|---|---|
| EP | 0 157 508 A2 | 10/1985 |
| EP | 0 439 258 A2 | 7/1991 |
| EP | 0 520 515 A2 | 12/1992 |
| EP | 0 530 729 A1 | 3/1993 |
| EP | 530 729 A1 | 3/1993 |
| EP | 0 252 739 B1 | 10/1993 |
| EP | 0 588 180 A1 | 3/1994 |
| EP | 0 622 833 A1 | 11/1994 |
| JP | 60189938 | 9/1985 |
| JP | 62-66825 | 3/1987 |
| JP | 62058638 | 3/1987 |
| JP | 62101677 | 5/1987 |
| JP | 62101678 | 5/1987 |
| JP | 62-121781 | 6/1987 |
| JP | 62181380 | 8/1987 |
| JP | 62271451 | 11/1987 |
| JP | 63153814 | 6/1988 |
| JP | 63160337 | 7/1988 |
| JP | 63176265 | 7/1988 |
| JP | 63177423 | 7/1988 |
| JP | 63194336 | 8/1988 |
| JP | 63241086 | 10/1988 |
| JP | 63270882 | 11/1988 |
| JP | 62396222 | 12/1988 |
| JP | 1-123884 | 5/1989 |
| JP | 2047833 | 2/1990 |
| JP | 3171627 | 7/1991 |
| JP | 4049618 | 2/1992 |

(List continued on next page.)

OTHER PUBLICATIONS

E.P. Chang, "Viscoelastic Winows of Pressure–Sensitive Adhesives", *J. Adhesion*, 34, 189–200 (1991).

C.A. Dahlquist, "Tack" in *Adhesion, Fundamentals and Practice*; Gordon and Breach Science Publishers: New York; pp. 143–151 (1969).

J. Pacansky et al., "Solid–State Electron Beam Chemistry of Mixtures of Diazoketones in Phenolic Resins: AZ Resists", *J. Phys. Chem.*, 92, 4558–4565 (1988).

*Handbook of Pressure–Sensitive Adhesive Technology, Second Edition*; D. Satas, Ed.: Van Nostrand Reinhold: New York; pp. 172–177 (1989).

*Primary Examiner*—Curtis Mayes

(57) ABSTRACT

A semiconductor wafer processing tape includes a permanent backing and a layer of a nonpressure sensitive adhesive. The tapes are useful for wafer grinding and/or wafer dicing applications. The nonpressure sensitive adhesive includes a copolymer of at least one of a first monoethylenically unsaturated monomer, at least one of a second monoethylenically unsaturated monomer, and at least one copolymerizable nonionic crosslinking agent; wherein the second monoethylenically unsaturated monomer is a reinforcing monomer having a homopolymer glass transition temperature higher than that of the first monoethylenically unsaturated monomer. A method of processing semiconductor wafers is also provided.

6 Claims, No Drawings

FOREIGN PATENT DOCUMENTS

| | | |
|---|---|---|
| JP | 4186832 | 7/1992 |
| JP | 4199516 | 7/1992 |
| JP | 4211145 | 8/1992 |
| JP | 5078629 | 3/1993 |
| JP | 5082492 | 4/1993 |
| JP | 5136260 | 6/1993 |
| JP | 5156215 | 6/1993 |
| JP | 5171117 | 7/1993 |
| JP | 5198542 | 8/1993 |
| JP | 5-230426 | 9/1993 |
| JP | 5335288 | 12/1993 |
| JP | 5345883 | 12/1993 |
| JP | 6029266 | 2/1994 |
| JP | 6065548 | 3/1994 |
| JP | 6073347 | 3/1994 |
| JP | 6077192 | 3/1994 |
| JP | 6077193 | 3/1994 |
| JP | 6077194 | 3/1994 |
| JP | 6-136183 | 5/1994 |
| JP | 6177094 | 6/1994 |
| JP | 7-29861 | 1/1995 |
| WO | WO 95/29766 | 11/1995 |
| WO | WO 96/33247 | 10/1996 |
| WO | WO 97/03461 | 1/1997 |

* cited by examiner

SEMICONDUCTOR WAFER PROCESSING TAPES

This is a divisional of application Ser. No. 09/050,476 filed Mar. 30, 1998, now U.S. Pat. No. 6,235,387.

BACKGROUND OF THE INVENTION

1. Field of the Invention

This invention relates generally to adhesive tapes useful for processing semiconductor wafers and, more specifically, to tapes having nonpressure sensitive adhesive compositions that include a copolymer of acrylic-functional monomers. These tapes are useful in the grinding and/or dicing of semiconductor wafers.

2. Description of the Related Art

Semiconductor integrated circuit (IC) chips are commonly used in electronic components, whether for sophisticated industrial machinery, automobiles or everyday household appliances. The production of semiconductor IC chips begins with the manufacture of semiconductor wafers containing many semiconductor elements. Ultimately, the wafer is sawn or diced into individual semiconductor elements (called die), each element becoming a semiconductor IC chip.

Typically, a semiconductor wafer is prepared by slicing or sawing a single, high purity silicon ingot into thin circular wafers about 500 microns ($\mu$m) to about 1000 $\mu$m thick. A wafer may be doped to alter its electrical properties. Electronic circuitry is then applied to the front side of the wafer, usually by photolithography. Separation lines are also photolithographed onto the wafer to provide saw marks for eventual dicing of the wafer into individual semiconductor IC chips.

Wafer diameters were traditionally about 3 inches (7.6 cm) to about 4 inches (10.2 cm). However, as individual IC chips have become larger, the typical wafer diameter has increased to about 5 inches (12.7 cm) to about 8 inches (20.3 cm) so as to permit more die to be formed from a single wafer. It is expected that wafer diameters will eventually expand to about 12 inches (30.5 cm) to about 16 inches (40.6 cm), and perhaps to even larger sizes.

To protect the delicate electronic circuitry from atmospheric contamination by dust, moisture, airborne corrosive acids and the like, the front side of the wafer is provided with a passivation or protective layer which may be an inorganic material such as silicon oxynitride or an organic material such as polyimide.

To facilitate the manufacture of electronic components, it is desirable to reduce the thickness of the wafers (and hence the thickness of the semiconductor IC chips formed therefrom). A common process involves holding the front side of the wafer against a vacuum table while grinding the backside of the wafer to a thickness of about 200 $\mu$m to about 500 $\mu$m in the presence of a water spray to remove the grinding debris. However, the wafers are inherently fragile and are susceptible to breaking during the grinding process, a problem which is enhanced as the wafer diameter becomes larger. Moreover, the front side of the wafer is held against the vacuum table, which could abrade the passivation/protective layer and the underlying circuitry. Consequently, there is a need to protect the wafer (especially the front side) from breakage, contamination, and abrasion.

Early approaches to this problem used a layer of paraffin wax over the front side of the wafer, with the wax being eventually removed by a solvent wash. The deficiencies of this approach are described in U.S. Pat. No. 4,853,286 (Narimatsu et al.). In other approaches, a photoresist coating was spin-coated onto the front side of the wafer, but this did not always eliminate wafer breakage.

Historically, adhesive products have been employed to protect the front side of the wafer. Sometimes the tapes are used alone and sometimes they are used in conjunction with a photoresist coating to provide a surface to which the tape can stick and to protect the passivation/protective layer from staining and/or delamination by the tape. However, according to the technical literature, adhesive tapes have not provided a complete solution to the wafer protection problem. The previously mentioned U.S. Pat. No. 4,853,286 indicates that wafer breakage still occurs and that the adhesive surface accumulates dust that can contaminate the wafer. Also, there can be difficulty in subsequently removing the tape if it has high initial adhesion to the wafer or if the adhesion increases from the time that the tape is applied to the wafer until it is removed.

Various adhesive tapes that are reportedly useful in semiconductor wafer backside grinding operations (sometimes referred to herein as "wafer grinding") have been described. For example, the aforementioned U.S. Pat. No. 4,853,286 discloses a wafer processing film that is used in the grinding of wafers to prevent breakage. The film includes a base film, a layer of a commercially available, common adhesive (such as an acrylic ester, urethane, or synthetic rubber adhesive) that can preferably include a nonionic surface active agent and an ethylene glycol derivative, and an optional supporting film laminated to the nonadhesive side of the base film. U.S. Pat. No. 5,126,178 (Takemura et al.) describes a wafer processing film that includes a base film with a pressure sensitive adhesive on one side (which is protected by a removable release film), and a phosphoric acid-based surfactant on the backside. The pressure sensitive adhesive can be acrylic-based, vinyl-based, or rubber-based, although an aqueous emulsion type pressure sensitive adhesive is preferred.

European Patent Publication No. 0 530 729 discloses a pressure sensitive adhesive tape used in grinding the backside of a semiconductor wafer. The pressure sensitive adhesive, which reportedly has a small initial adhesion and shows no adhesion strength increase with time, comprises an aqueous acrylic resin emulsion adhesive, a nonionic surfactant, an epoxy type and/or an aziridine type crosslinking agent, and a water soluble organic compound.

However, there still remains a need for an adhesive tape that has even greater utility in semiconductor wafer grinding processes. Preferably, such tapes will possess several desirable properties. For example, the tape should preferably quickly provide sufficient initial adhesion to surfaces such as silicon, polyimide, silicon oxynitride, and other integrated circuit coatings such that the semiconductor wafers will readily survive post-processing steps yet be easily removed when required. Preferably, a single tape will provide acceptable initial adhesion to each of these surfaces so as to eliminate the need for storing different tapes for different surfaces. However, the final adhesion should not be so high that removing the tape breaks or fractures a larger number of wafers than is permitted under conventional industry standards (typically about one wafer or less per one thousand), or leaves adhesive residue that could impair subsequent processing of the wafer. Many tapes used in the semiconductor industry require the application of heat to the wafer at the time of removal of the tape to prevent the wafer from being broken. It would be desirable if no such heating step were required.

It would also be desirable if the initial and final adhesion properties of the tape were preferably maintained over several days and, more preferably, over several weeks of storage. That is, preferably, there should be no process or material-limiting increase in adhesion over time (sometimes referred to as adhesion build), a problem associated with certain adhesives. Similarly and preferably, there should be no other significant change in adhesion over time, as could occur if fugitive or migratory surfactants and other mobile components in the adhesive migrate to the adhesive bond line so as to form a weak boundary layer. An adhesive that generally maintains its initial and final adhesion properties during storage would not only provide tapes having long shelf lives, but would also eliminate the need to carry out the grinding process shortly after taping the semiconductor wafers.

Another desirable attribute would be the ability to remove the adhesive tape without substantial staining, which refers to a change in the optical density of the semiconductor wafer that is detected when the semiconductor wafer is viewed under a microscope. This typically results from microscopic amounts of adhesive residue being left on the passivation layer, although it could also result from partial removal of the passivation layer. It would also be desirable if the adhesive were generally insensitive to water so as to prevent the tape from being loosened by the water spray used during grinding. Furthermore, it would be desirable for the adhesive to have a generally flat profile so that unevenness in grinding can be avoided. Also, it would be desirable if the tape did not contribute significantly to the formation of edge debris during trimming of excess tape upon application to a wafer.

Following wafer grinding, there are typically several intermediate manufacturing steps before the semiconductor wafers are sawed or diced into individual semiconductor IC chips. Wafer dicing is conventionally carried out by attaching the ground backside of the wafer to the adhesive surface of a tape (often called a dicing tape), securing the taped wafer to a vacuum table to restrain it against movement, and using a water-sprayed rotary diamond saw to cut along the saw marks previously photolithographed onto the semiconductor wafer. The individual semiconductor IC chips are then removed from the dicing tape. This operation is usually facilitated by a needle or probe that pushes up against the backing of the dicing tape in the area of the IC chip while a vacuum pick-up simultaneously grasps the top of the IC chip to remove it from the dicing tape. The removed IC chips may then be further processed immediately, or they may be stored for later assembly into a finished article.

Prior technical publications describe various difficulties encountered when using adhesive dicing tapes. For example, European Patent Publication No. 0 157 508 discusses the need for an adhesion level sufficient to permit the semiconductor wafers to stick to the tape but without being so high as to impede removal of the diced IC chips.

Adhesive products, particularly pressure sensitive adhesive tapes, for use in wafer dicing operations have been previously described. For example, European Patent Publication No. 0 588 180 describes a dicing tape that includes a radiation transparent film and a radiation crosslinkable pressure sensitive adhesive that contains a copolymerized radiation-initiator. The pressure sensitive adhesive may be synthesized from (meth)acrylic acid, (meth)acrylic ester, vinyl acetate, or various vinyl alkyl ether monomers.

Japanese Kokai Patent Application No. 62-121781 describes a semiconductor wafer dicing film in which a conventional pressure sensitive adhesive is applied to a butene type polymer film. Japanese Kokai Patent Application No. 5-230426 discloses an adhesive tape for wafer dicing that includes an adhesive layer (especially an acrylic type adhesive) on a base film made of a rubber-like elastic material.

The previously referred to European Patent Publication No. 0 157 508 describes a thin adhesive sheet which is used to protect a semiconductor wafer during the polishing step or to fix the wafer when cutting and separating the semiconductor wafer into the IC element chips. The adhesive sheet includes a light-permeable support and a pressure sensitive adhesive that can cure by light irradiation to form a three-dimensional network structure. The adhesive comprises a mixture of a rubber- or acryl-based pressure sensitive adhesive, a photopolymerizable compound, and a photopolymerization initiator.

However, there still remains a need for an adhesive tape that has even greater utility in semiconductor wafer dicing processes. Preferably, such tapes will possess several desirable properties. For example, the tape should preferably provide sufficient initial adhesion to the silicon wafer (as well as other surfaces to which the tape may need to adhere such as gold plating or stainless steel machine parts) such that the resulting semiconductor IC chips will not come loose during wafer dicing. However, the final adhesion should not be so high that the semiconductor IC chips fracture or break upon removal from the tape. It would also be desirable if the initial and final adhesion properties of the tape were preferably maintained over several days and, more preferably, over several weeks of storage since several days or weeks may pass between the time that the semiconductor wafers are attached to the dicing tape and the time that the resulting semiconductor IC chips are removed from the tape after dicing. If the adhesion increases substantially over time, it may be necessary to remove the diced semiconductor IC chips from the tape and store them, unless they will be used immediately after dicing.

The semiconductor IC chip should also preferably remove cleanly from the adhesive tape so as to not leave adhesive residue that could interfere with subsequent processing such as soldering and packaging of the IC chips. It would also be advantageous if the adhesive from the tape did not stick to the saw blade as this could require periodically interrupting the wafer dicing operation to clean the accumulated adhesive residue from the blade so as to prevent contamination of the semiconductor IC chips. Also, if the adhesive does not significantly stick to the saw blade, then it could be possible to employ a thicker layer of adhesive, which could be advantageous in preventing the saw blade from inadvertently cutting into the tape backing. If the tape backing is partially cut into during wafer dicing; the tape could be weakened and break prematurely during subsequent processing.

It would also be desirable if the adhesive were generally insensitive to water so as to prevent too many chips from being loosened by the water spray used in the dicing process. Furthermore, it would be desirable if the tape did not contribute significantly to the formation of edge debris when trimmed prior to a wafer dicing operation.

Finally, it would be advantageous to have a single adhesive tape that could be used in both wafer grinding and wafer dicing operations so as to eliminate the need for storing different tapes for different processes. The present invention provides wafer processing adhesives and tapes that have one or more of these desirable properties and can be used in grinding and/or dicing operations during the manufacture of semiconductor wafers.

SUMMARY OF THE INVENTION

This invention relates generally to tapes useful for processing semiconductor wafers, including the grinding and/or dicing of semiconductor wafers. The tapes include adhesive compositions that are not pressure sensitive (i.e., nonpressure sensitive adhesive compositions). Preferred adhesive compositions used in the wafer processing tapes of the invention provide acceptable levels (generally, relatively low levels) of initial adhesion to substrates such as polyimide layers, silicon oxynitride layers, and silicon, for example. Preferred embodiments show acceptable levels (generally, relatively low levels) of adhesion build over time such that semiconductor wafers and/or semiconductor IC chips can be readily removed from the wafer processing tapes, preferably, without leaving visible amounts of adhesive residue, and without the application of heat or irradiation after grinding or dicing. Furthermore, preferred embodiments include nonpressure sensitive adhesives that are substantially free of fugitive or migratory surfactants and tackifiers, and other fugitive or migratory components. Such components are typically undesirable because they are believed to migrate to the adhesive bond line and form a weak boundary layer.

The invention provides a semiconductor wafer processing tape that comprises a permanent backing and a layer of a nonpressure sensitive adhesive on the permanent backing. Preferably, the nonpressure sensitive adhesive has a storage modulus at room temperature (i.e., about 20° C. to about 25° C.) that is greater than about $1.0 \times 10^5$ Pascals and includes a copolymer comprising at least one of a first copolymerized monoethylenically unsaturated monomer, at least one of a second copolymerized monoethylenically unsaturated monomer, and at least one copolymerized nonionic crosslinking agent. The second monoethylenically unsaturated monomer is a reinforcing monomer having a homopolymer glass transition temperature higher than that of the first monoethylenically unsaturated monomer. The reinforcing monomer is one that increases the glass transition temperature and modulus of the resultant copolymer.

Preferably, the adhesive comprises a copolymer of at least one monoethylenically unsaturated monomer (i.e., monomer A) having a homopolymer glass transition temperature (Tg) of no greater than about 0° C., at least one monoethylenically unsaturated reinforcing monomer (i.e., monomer B) having a homopolymer glass transition temperature (Tg) of at least about 10° C., and at least one copolymerizable nonionic crosslinking agent (i.e., monomer C). Adhesive compositions that do not include a crosslinking agent typically have rapidly developing adhesion build, which can be very undesirable.

More preferably, the adhesive copolymer comprises: (A) at least one copolymerized acrylic or methacrylic acid ester of a non-tertiary alkyl alcohol in which the alkyl group contains about 4 to about 14 carbon atoms (on average), which has a homopolymer Tg of no greater than about 0° C.; (B) at least one copolymerized reinforcing monofunctional acrylic monomer, which has a homopolymer Tg of at least about 10° C.; and (C) a nonionic copolymerized photoreactive crosslinking (i.e., photocrosslinking) agent, which can be an acrylic crosslinking monomer (monomer C1), or an olefinically unsaturated compound (monomer C2), which, in the excited state, is capable of abstracting hydrogen.

Preferred semiconductor wafer processing tapes according to the invention exhibit an initial (i.e., at the time of applying the tape to a substrate) peel adhesion of about 5 grams per linear inch width to about 500 grams per linear inch width, and more preferably, about 20 grams per linear inch width to about 300 grams per linear inch width, to a substrate comprising at least one of silicon, polyimide, or silicon oxynitride. More preferred semiconductor wafer processing tapes according to the invention maintain this level of peel adhesion even after dwelling in contact with the substrate for 7 days under ambient conditions (e.g., room temperature, pressure, and humidity).

A further embodiment of the invention is a semiconductor wafer processing tape (i.e., a grinding and/or dicing tape) comprising a permanent backing and a layer of an adhesive that is not pressure sensitive (i.e., a nonpressure sensitive adhesive) on the permanent backing, wherein the adhesive displays a storage modulus at 24° C. of about $1.0 \times 10^6$ Pascals to about $5.0 \times 10^7$ Pascals. Other embodiments of the invention include wafer dicing tapes and wafer grinding tapes having the constructions described above.

The invention also relates to a method of processing a semiconductor wafer. The method comprises the steps of:

(a) providing a semiconductor wafer;

(b) adhesively bonding the semiconductor wafer to an adhesive surface of a semiconductor wafer processing tape that comprises a permanent backing and a layer of a nonpressure sensitive adhesive on the permanent backing;

(c) processing the semiconductor wafer by either grinding the backside of the wafer or dicing the wafer into integrated circuit semiconductor chips; and (d) removing the tape (preferably, without the application of heat or irradiation) without a substantial change in optical density of the wafer. The nonpressure sensitive adhesive is described above.

DETAILED DESCRIPTION OF THE PREFERRED EMBODIMENTS

This invention relates broadly to adhesive tapes that are useful in wafer processing applications, including wafer grinding and/or wafer dicing processes. "Wafer grinding" as used herein refers to the process of grinding the backside of a semiconductor wafer so as to reduce its thickness, a procedure well known in the manufacture of semiconductor wafers. "Wafer dicing" as used herein refers to the sawing or dicing of a semiconductor wafer into individual die or semiconductor IC chips, which is also a well known step in the conversion of semiconductor wafers into IC chips.

The preferred adhesive compositions and wafer processing tapes of the invention provide relatively low initial and final adhesion to semiconductor substrates containing materials such as silicon or various organic or inorganic layers (e.g., polymide, silicon oxynitride). The preferred embodiments show acceptable levels of adhesion build over time such that semiconductor wafers and/or semiconductor IC chips can be readily removed from the wafer processing tapes of the invention without breaking or fracturing in greater numbers than permitted by industrial standards and without leaving visible (to the unaided eye or through a light microscope) amounts of adhesive residue. Significantly, this can occur without post-processing procedures. That is, tapes of the present invention typically do not require the application of heat or irradiation after dicing or grinding to provide easy removal. Preferably and advantageously, these wafer processing tapes can provide a peel adhesion of about 5 grams per linear inch width to about 500 grams per linear inch width, and more preferably, about 20 grams per linear inch width to about 300 grams per linear inch width. More preferably, this level of adhesion is exhibited both initially upon application of the tape to a semiconductor wafer and after dwelling in contact with the wafer for 7 days under ambient conditions. In practice, the lowest level of adhesion able to hold the wafer in place during the grinding and/or dicing processes is preferred. Other adhesion levels than those reported here may be acceptable in certain applications.

Highly preferred embodiments of the invention exhibit these attributes to several, and most preferably, to all of the substrate surfaces mentioned above. Preferred embodiments of the invention can also be removed from semiconductor wafers and/or semiconductor IC chips without post-processing procedures and without substantial staining. Staining can result from adhesive residue on the wafer or removal of passivation material. Staining can be evaluated by looking for changes in optical density on the surface of a wafer. Thus, preferably there is no substantial change in optical density on the surface of a wafer as a result of using tapes of the present invention.

Importantly, the wafer processing tapes of the present invention display desirable cutting quality. By this it is meant that the amount of cutting debris generated during trimming operations is acceptable to the industry. In actual use, cutting quality is typically a function of the shape, sharpness and temperature of the cutting tool, the cutting angles and rate, as well as the type and thickness of the backing and adhesive used. Modifications of one or more such parameters can broaden the types of adhesives which may be employed in tapes of the invention.

Significantly and preferably, the wafer processing tapes of the invention are also stable in water. That is, the adhesive composition is not significantly soluble or swellable in water.

In one aspect, the wafer processing tapes of the invention include a permanent backing and a layer of a nonpressure sensitive adhesive (non-PSA) on the permanent backing, wherein the non-PSA includes a copolymer of at least one of a first monoethylenically unsaturated monomer, at least one of a second monoethylenically unsaturated monomer, and at least one nonionic crosslinking agent. The second monoethylenically unsaturated monomer is a reinforcing monomer having a homopolymer glass transition temperature (Tg) higher than that of the first monoethylenically unsaturated monomer.

By a "permanent backing" is meant a substrate or backing layer which is intended to form an integral part of the wafer processing tape rather than being a removable or releasable component, such as a temporary, protective release liner (although, such a release liner can also be used). To promote wide utility in the wafer processing tapes of the invention, the permanent backing will desirably possess several properties. For example, the permanent backing should be sufficiently flexible to permit it to be wound about a core into roll form for easily handling, storing, and shipping. Also, the permanent backing should have the ability to be cut by a knife so as to permit the manufacture of wide webs that can be subsequently slit or cut into narrower widths that can be more easily used, as well as to accommodate semiconductor IC chip manufacturing steps that will require the permanent backing to be cut. Preferably, the permanent backing will contain no more water extractable compounds or ionic components than are permitted under conventional wafer processing industry standards and, more preferably, will be substantially free from such materials so as to reduce the water sensitivity of the permanent backing and to reduce the likelihood of the semiconductor wafers becoming contaminated by these materials.

Permanent backings useful in the wafer processing tapes of the invention may be provided as a single layer film or as a multi-layer film. The thickness of the backing may vary widely so long as the resulting tape can be readily handled by wafer grinding and wafer dicing equipment. Within these guidelines, the thickness of the permanent backing is typically about 5 µm to about 500 µm, although for wafer dicing tapes it is preferred that the permanent backing have a thickness of about 12 µm to about 50 µm. More preferably, the permanent backing for wafer dicing tapes has a thickness of about 12 µm to about 25 µm, and most preferably, a thickness of about 12 µm to about 15 µm. Also, wafer processing tapes specifically intended for use in dicing applications are preferred to be sufficiently stretchable that they can accommodate the use of a push-up needle or probe that may be employed to facilitate removal of a semiconductor die. Accordingly, permanent backings preferred for use in wafer dicing tapes display a tensile strength at break in the machine direction of about 70 kiloPascals to about 240 kiloPascals (kPa) and, in the transverse direction, about 100 kPa to about 300 kPa. Similarly, the machine direction elongation at break of permanent backings preferred for use in wafer dicing tapes is about 100% to about 200% (more preferably about 120% to about 165%), and about 30% to about 90% in the transverse direction. Permanent backings having a tensile strength less than this range or an elongation greater than this range will stretch more when contacted by a semiconductor IC chip removal probe than the permanent backings of the invention preferred for use in wafer dicing processes. As a result, such backings not within the preferred ranges can result in slower manufacturing speeds since the probe travel distance will be increased. Moreover, as the stiffness of the permanent backing increases (i.e., high tensile strength, low elongation) it is easier to handle the larger diameter semiconductor wafers that are becoming more common.

Materials from which the permanent backings useful in the wafer processing tapes of the invention may be made include polyolefins (e.g., polyethylene, polypropylene, polybutene and polymethylpentene), ethylene/vinyl monomer copolymers (e.g., ethylene/(meth)acrylic acid copolymer and ethylene/vinyl acetate copolymer), polybutadiene, poly(vinylchloride), polyurethane, polyamide, and polyester (especially polyethylene terephthalate). Optionally, the permanent backings can be primed. That is, to enhance bonding of a non-PSA adhesive to a permanent backing, the permanent backing can include a primed surface. The primed surface can result from the use of a chemical primer layer or priming with a corona treatment process, for example.

Adhesive compositions useful in the invention are non-pressure sensitive adhesive (i.e., non-PSA) materials that comprise and, more preferably, consist essentially of, a copolymer of at least one monoethylenically unsaturated monomer having a homopolymer glass transition temperature (Tg) of no greater than about 0° C., at least one monoethylenically unsaturated reinforcing monomer having a homopolymer glass transition temperature (Tg) of at least about 10° C., and at least one nonionic crosslinking agent. Such adhesive compositions are preferably substantially free of fugitive or migratory surfactants and tackifiers, and other fugitive or migratory components. They also are preferably substantially free of urethane acrylates, which can contribute to staining of a wafer due to impurities that are produced during the synthesis of such acrylates.

By a "non-PSA" is meant an adhesive that does not display pressure sensitive properties. A pressure sensitive adhesive is conventionally understood to refer to an adhesive that displays permanent and aggressive tackiness to a wide variety of substrates after applying only light pressure. An accepted quantitative description of a pressure sensitive adhesive is given by the Dahlquist criterion line, which indicates that materials having a storage modulus (G') of less than about $1.0 \times 10^5$ Pascals (measured at room temperature) have pressure sensitive adhesive properties while materials having a G' in excess of this value do not. Thus, more specifically, a non-PSA, as used herein, refers to a material that has a storage modulus at least above the Dahlquist criterion, and more preferably, a storage modulus at least about $1.0 \times 10^6$ Pascals. Preferably, materials having a storage modulus of no greater than about $5.0 \times 10^7$ Pascals have particularly desirable levels of adhesion.

The non-PSA copolymer useful in the present invention is preferably a copolymer of at least two different types of polymerizable monoethylenically unsaturated monomers and a copolymerizable nonionic crosslinking agent. Thus, a "copolymer," as used herein, includes a polymer of three or more types of polymerizable monomers, and therefore refers to terpolymers, tetrapolymers, etc. This can include random copolymers, block copolymers, or sequential polymers. As used herein, copolymers exclude graft copolymers and blends or interpenetrating networks of different homopolymers or copolymers.

The monomers useful in preparing the non-PSA copolymer of the present invention preferably include: (A) a monoethylenically unsaturated monomer (i.e., with one carbon-carbon double bond) that, when homopolymerized, generally has a glass transition temperature of no greater than about 0° C.; (B) a monoethylenically unsaturated reinforcing monomer that, when homopolymerized, generally has a glass transition temperature of at least about 10° C.; and (C) a nonionic crosslinking agent that is copolymerizable with monomers A and/or B. The glass transition temperatures of the homopolymers of monomers A and B are typically accurate to within ±5° C. and are measured by differential scanning calorimetry.

Monomer A, which is a monoethylenically unsaturated monomer preferably having a homopolymer Tg of no greater than about 0° C., such as a monofunctional alkyl acrylate or methacrylate (i.e., (meth)acrylic acid ester), contributes to the flexibility and adhesion of the copolymer. Monomer A can be a (meth)acrylic acid ester, an alpha-olefin, a vinyl ether, an allyl ether, a maleate, or other monofunctional monomers that will copolymerize with monomers B and C. Preferably, monomer A is a monofunctional (meth)acrylic acid ester (i.e., an alkyl acrylate or methacrylate). The term "monofunctional" in this context refers to a mono-acrylic monomer or a monomer containing one acrylic functionality, although other functionality can be present. Preferably, the alkyl group of the (meth)acrylate has about 4 to about 14 carbon atoms (on average). The alkyl group can optionally contain oxygen atoms in the chain thereby forming ethers, for example. Examples of monomer A include, but are not limited to, 2-methylbutyl acrylate, isooctyl acrylate, lauryl acrylate, 4-methyl-2-pentyl acrylate, isoamyl acrylate, sec-butyl acrylate, n-butyl acrylate, n-hexyl acrylate, 2-ethylhexyl acrylate, n-octyl acrylate, n-decyl acrylate, isodecyl acrylate, isodecyl methacrylate, and isononyl acrylate. Other examples include, but are not limited to, poly-ethoxylated or -propoxylated methoxy (meth)acrylate (i.e., poly(ethylene/propylene oxide) mono-(meth)acrylate) macromers (i.e., macromolecular monomers), polymethylvinyl ether mono (meth)acrylate macromers, and ethoxylated or propoxylated nonyl-phenol acrylate macromers. The molecular weight of such macromers is typically about 100 grams/mole to about 600 grams/mole, and preferably, about 300 grams/mole to about 600 grams/mole. Preferred monofunctional (meth) acrylates that can be used as monomer A include 2-methylbutyl acrylate, 2-ethylhexyl acrylate, isooctyl acrylate, lauryl acrylate, and poly(ethoxylated)methoxy acrylate. Combinations of various monofunctional monomers categorized as an A monomer can be used to make the copolymer of the present invention.

Monomer B, which is a monethylenically unsaturated reinforcing monomer preferably having a homopolymer Tg of at least about 10° C., increases the glass transition temperature of the copolymer. Thus, as used herein, "reinforcing" monomers are those that increase the modulus of the adhesive, and thereby its strength. Monomer B can be (meth)acrylic acid, a (meth)acrylate, a (meth)acrylamide, an alpha-olefin, a vinyl ether, and an allyl ether, a styrenic monomer, a maleate, or other monofunctional monomers that will copolymerize with monomers A and C. Preferably, monomer B is a reinforcing monofunctional acrylic monomer, such as acrylic acid, an acrylamide, or an acrylate. The term "monofunctional" in this context refers to a mono-acrylic monomer or a monomer containing one acrylic functionality, although other functionality can be present. Examples of monomer B include, but are not limited to, acrylamides, such as acrylamide, methacrylamide, N-methyl acrylamide, N-ethyl acrylamide, N-methylol acrylamide, N-hydroxyethyl acrylamide, diacetone acrylamide, N,N-dimethyl acrylamide, N,N-diethyl acrylamide, N-ethyl-N-aminoethyl acrylamide, N-ethyl-N-hydroxyethyl acrylamide, N,N-dimethylol acrylamide, N,N-dihydroxyethyl acrylamide, t-butyl acrylamide, dimethylaminoethyl acrylamide, N-octyl acrylamide, and 1,1,3,3-tetramethylbutyl acrylamide. Other examples of monomer B include acrylic acid, methacrylic acid, itaconic acid, crotonic acid, maleic acid, fumaric acid, 2,2'-(ethoxyethoxy)ethyl acrylate, 2-hydroxyethyl acrylate or methacrylate, 2-hydroxypropyl acrylate or methacrylate, 3-hydroxypropyl acrylate or methacrylate, t-butyl acrylate, n-butyl methacrylate, isobornyl acrylate, 2-(phenoxy)ethyl acrylate or methacrylate, biphenylyl acrylate, t-butylphenyl acrylate, cyclohexyl acrylate, dimethyladamantyl acrylate, 2-naphthyl acrylate, phenyl acrylate, N-vinyl pyrrolidone, and N-vinyl caprolactam. Preferred reinforcing monofunctional acrylic monomers that can be used as monomer B include acrylic acid, t-butyl acrylate, N,N-dimethyl acrylamide, 1,1,3,3-tetramethylbutyl acrylamide, N-octyl acrylamide, 2-hydroxypropyl acrylate, 3-hydroxypropyl acrylate, isobornyl acrylate, and 2-(phenoxy)ethyl acrylate. Combinations of various reinforcing monofunctional monomers categorized as a B monomer can be used to make the copolymer of the present invention.

Monomer C, which is a nonionic crosslinking agent that copolymerizes with monomers A and B, increases the glass transition temperature of the copolymer, modifies its adhesion, and improves its cutting quality (i.e., decreases the amount of cutting debris). The crosslinking agent typically produces chemical crosslinks (e.g., covalent bonds). Prior to application of the tape to a wafer, the crosslinking functionality is consumed, i.e., it is essentially completely reacted with monomers A and B. Preferably, if monomer C contains ethylenic unsaturation, it is incorporated into the backbone of the copolymer by copolymerization with monomers A and B through the ethylenic unsaturation. That is, the crosslinking functionality of the copolymer is not grafted onto a copolymer of monomers A and B. Suitable crosslinking agents are disclosed in U.S. Pat. Nos. 4,379,201 (Heilmann), 4,737,559 (Kellen), and 5,506,279 (Babu et al.). Preferably, monomer C is a nonionic photocrosslinking agent, which, upon exposure to ultraviolet radiation (e.g., radiation having a wavelength of about 250 nanometers to about 400 nanometers), causes the copolymer to crosslink. More preferably, monomer C is (1) a polyfunctional acrylic crosslinking monomer, or (2) an olefinically unsaturated compound, which, in the excited state, is capable of abstracting hydrogen. Each of these monomers (C1 and C2) is a free-radically polymerizable monomer capable of copolymerizing with monomers A and/or B. Combinations of various crosslinking agents can be used to make the nonpressure sensitive adhesive of the present invention. Preferably, monomer C does not include a urethane acrylate because adhesives containing them can produce undesirable wafer staining.

One type of nonionic crosslinking monomer (i.e., monomer C1) is a polyfunctional acrylic crosslinking monomer that preferably has an average of less than about 12 atoms in the chain between acrylic groups. The term "polyfunctional" as used herein refers to crosslinking agents that possess two or more free radically polymerizable ethylenically unsaturated groups. Examples of this type of monomer C1 include, but are not limited to, trimethylolpropane triacrylate, 1,6-hexanediol diacrylate, pentaerythritol tetraacrylate, 1,2-ethylene glycol diacrylate, dodecyl diacrylate, and the diacrylate of ethylene oxide modified bisphenol A. Combinations of acrylic crosslinking monomers can be used to make the nonpressure sensitive adhesive of the present invention.

Another type of nonionic crosslinking monomer (i.e., monomer C2) is an olefinically unsaturated compound that is copolymerized with monomers A and B and generates free radicals in the polymer backbone upon irradiation of the polymer. Examples of such a monomer include an acrylated benzophenone as described in U.S. Pat. No. 4,737,559 (Kellen et al.), p-acryloxy-benzophenone, which is available from Sartomer Company, Exton, Pa., and monomers described in U.S. Pat. No. 5,073,611 (Rehrner et al.) including p-N-(methacryloyl-4-oxapentamethylene)-carbamoyloxybenzophenone, N-(benzoyl-p-phenylene)-N'-(methacryloxymethylene)-carbodiimide, and p-acryloxy-benzophenone. U.S. Pat. No. 5,506,279 (Babu et al.) at columns 5–6 describes another suitable olefinically unsaturated crosslinking agent referred to therein as Formula 2, which is {2-[4-(2-hydroxy-2-methyl-propan-1-one) phenoxy]} ethyl (2-methyl-2-(2-methyl-2-propen-1-one) amino)propanoate. The olefinically unsaturated compound which, in the excited state, is capable of abstracting hydrogen preferably includes acrylic functionality. Combinations of such crosslinking monomers can be used to make the copolymer of the present invention.

Monomers A, B, and C are used in amounts to produce a copolymer having nonpressure sensitive adhesive properties as defined above, and desirable properties with respect to adhesion, stain, and cutting characteristics in the wafer processing industry. Preferably, the monomers are used to make the copolymer useful in the nonpressure sensitive adhesive composition of the present invention in amounts of about 60 parts to about 85 parts of monomer A and about 10 parts to about 30 parts of monomer B. More preferably, the monomers are used in amounts of about 70 parts to about 85 parts of monomer A and about 10 parts to about 20 parts monomer B. All parts referred to herein are by weight unless otherwise specified. The sum of monomer A, monomer B, and monomer C is 100 parts by weight.

Monomer C (i.e., the nonionic crosslinking agent) is used in an effective amount, by which is meant an amount that is sufficient to cause crosslinking of the adhesive to provide the desired final adhesion properties to the substrate of interest prior to application of the tape to a wafer. An insufficient amount of crosslinking agent may cause ineffective curing of the adhesive composition such that the adhesion still remains too high and/or the cutting characteristics are undesirable, while excess crosslinking agent may also result in undesirable adhesion and/or cutting characteristics. If the crosslinking agent is an acrylic monomer, it is preferably used in an amount of about 5 parts to about 30 parts, and more preferably, about 10 parts to about 20 parts, based on the total amount of monomers. If the crosslinking agent is an olefinically unsaturated, copolymerizable photoreactive compound which, in the excited state, is capable of abstracting hydrogen, it is preferably used in an amount of about 1 part to about 10 parts, and more preferably, about 1 part to about 5 parts by weight, based on 100 parts of the total monomer content.

Surprisingly, incorporation of a crosslinking agent into an acrylic copolymer prior to use on a wafer provides adequate adhesion of the tape to the wafer, but not so much as to require post-processing (e.g., heating or irradiation to reduce adhesion after grinding or dicing). This is in contrast to conventional wafer processing tapes that use blends of an adhesive copolymer of monomers A and B, for example, with compounds analogous to monomer C. Tapes with such adhesive blends are applied to a wafer, processed, and then prior to removal from the wafer, irradiated to polymerize the third monomer to form an interpenetrating network of the copolymer of A and B with a homopolymer of the C monomer. This interpenetrating network has reduced adhesion, thereby allowing the wafer to be removed. By incorporating a crosslinking agent into the copolymer of monomers A and B prior to application of the tape to a wafer, the need for such post-processing is eliminated.

Polymerization of monomers A, B, and crosslinker C, to form the copolymer useful in the nonpressure sensitive adhesive composition of the present invention is typically carried out using thermal energy, electron-beam radiation, ultraviolet radiation, and the like. Such polymerization can be facilitated by a polymerization initiator, which can be a thermal initiator or a photoinitiator. Photoinitiators can be used with either preferred class of crosslinking agents, whereas thermal initiators are typically only used with the preferred class of crosslinking agents referred to above as the C2 monomer. Examples of suitable photoinitiators include, but are not limited to, benzoin ethers such as benzoin methyl ether and benzoin isopropyl ether, substituted benzoin ethers such as anisoin methyl ether, substituted acetophenones such as 2,2-dimethoxy-2-phenylacetophenone, and substituted alpha-ketols such as 2-methyl-2-hydroxypropiophenone. Examples of commercially available photoinitiators include IRGACURE 819 and DAROCUR 1173, both from Ciba-Geigy Corp., Hawthorne, N.Y., and LUCERIN TPO from BASF, Parsippany, N.J. Examples of suitable thermal initiators include, but are not limited to, peroxides such as dibenzoyl peroxide, dilauryl peroxide, methyl ethyl ketone peroxide, cumene hydroperoxide, dicyclohexyl peroxydicarbonate, as well as 2,2-azo-bis(isobutryonitrile), and t-butyl perbenzoate. Examples of commercially available thermal initiators include VAZO 64 from ACROS Organics, Pittsburg, Pa., and LUCIDOL 70 from Elf Atochem North America, Philadelphia, Pa. The polymerization initiator is used in an amount effective to facilitate polymerization of the monomers. Preferably, the polymerization initiator is used in an amount of about 0.1 part to about 5.0 parts, and more preferably, about 0.2 part to about 1.0 part by weight, based on the total monomer content.

If a photocrosslinking agent has been used, the coated adhesive can be exposed to ultraviolet radiation having a wavelength of about 250 nm to about 400 nm. The radiant energy in this preferred range of wavelength required to crosslink the adhesive is about 100 millijoules/cm$^2$ to about 1,500 millijoules/cm$^2$, and more preferably, about 200 millijoules/cm$^2$ to about 800 millijoules/cm$^2$.

The copolymers of the present invention can be prepared by a variety of techniques, which may or may not include solvent or chain transfer agents (e.g., CBr$_4$) to control molecular weight. These techniques may involve the use of appropriate polymerization initiators. A preferred solvent-free polymerization method for preparing a copolymer using monomers A, B, and C is disclosed in U.S. Pat. No. 4,379,201 (Heilmann et al.). Initially, a mixture of monomers A and B is polymerized with a portion of a photoinitiator by exposing the mixture to UV radiation in an inert environment for a time sufficient to form a coatable base syrup, and subsequently adding monomer C and the remainder of the photoinitiator. This final syrup containing monomer C (e.g., having a Brookfield viscosity of about 100 centipoise to about 6000 centipoise at 23° C., as measured with a No. 4 LTV spindle, at 60 revolutions per minute) is then coated onto a substrate, such as a permanent backing. Once the syrup is coated onto a permanent backing, further polymerization and crosslinking is typically carried out in an inert environment (i.e., an environment that is nonreactive with the monomer mixture). Suitable inert environments include nitrogen, carbon dioxide, helium, and argon, which exclude oxygen. A sufficiently inert atmosphere can be achieved by covering a layer of the photoactive syrup with a polymeric film, such as polyethylene terephthalate (PET) film, that is transparent to UV radiation or e-beam and irradiating through the film in air.

A preferred solution polymerization method for preparing a copolymer using monomers A, B, and C2 is disclosed in U.S. Pat. No. 5,073,611 (Rehmer et al.). Suitable solvents for such preparation methods include, for example, hydrocarbons such as benzene, toluene, xylene, normal hexanes, cyclohexane, as well as esters, alcohols, ethers, and mixtures thereof. For carrying out the polymerization in solution, some or all of the solvent is heated with some of the monomer mixture and some or all of the thermal initiator. When the polymerization begins, the remainder of the monomer mixture, and where relevant, the remainder of the thermal initiator and the solvent are added. After polymerization, the composition can be coated onto a backing and the solvent can be removed by evaporation with or without heat.

A latex polymerization method for preparing a copolymer using monomers A, B, and C2 is disclosed in U.S. Pat. No. 5,424,122 (Crandall et al.). For example, a latex emulsion polymerization is carried out by combining monomers A, B, and C2, an oleophilic nonionic free radical initiator, water, and a nonionic surfactant. The mixture is homogenized to form an emulsion followed by initiation of free radical polymerization, typically done using heat, while agitating the emulsion under an inert atmosphere. After polymerization the latex can be coated onto a solid substrate and dried, typically at a temperature of at least about 65° C. If necessary, water can be added or removed to reach an appropriate coating viscosity.

Certain of the copolymers of acrylic functional monomers useful in the invention may have inherent levels of adhesion that are either too low or too high for maximum utility in wafer processing applications. In addition, certain of the copolymers of acrylic functional monomers may insufficiently wet the substrate surface to be bonded, may form a low quality coating, may be difficult to coat, or a combination thereof, for best utility in wafer processing applications. Accordingly, the adhesive compositions of the invention may further and optionally comprise an adhesion modifier such as a tackifying resin or a liquid rubber to increase the inherent adhesion, wetting ability, or coatability of the copolymer of acrylic functional monomers. These may be copolymerizable with one or more of monomers A, B, and C. Minor amounts of various other additives can also be included in the adhesive compositions. Such additives include pigments, dyes, plasticizers, fillers, stabilizers, ultraviolet absorbers, antioxidants, processing oils, surfactants, and the like. The amount of each additive used can vary depending on the final properties desired. Preferably, however, the nonpressure sensitive adhesive compositions of the present invention are substantially free of additives that are fugitive or migratory (e.g., certain surfactants and tackifiers). Furthermore, to provide enhanced utility in wafer processing applications, the wafer processing tapes should be essentially free of ionic impurities that could migrate onto and contaminate the IC semiconductor wafer.

The non-PSA compositions of the present invention may then be applied to the permanent backing by a variety of coating methods including knife coating, slotted knife coating, or reverse roll coating. If the composition includes a solvent, it is then dried at a temperature (e.g., about 65° C. to about 120° C.) and a time (e.g., several minutes to about one hour) so as to provide an adhesive tape. The thickness of the layer of adhesive may vary over a broad range of about 10 microns to several hundred microns (e.g., about 200 microns), although for wafer grinding processes, an adhesive thickness of about 25 $\mu$m to about 90 $\mu$m is more preferred, while an adhesive thickness of about 50 $\mu$m to about 100 $\mu$m may be used for tapes employed in wafer dicing processes.

Once the adhesive composition has been substantially fully cured and crosslinked so as to provide a wafer processing tape, the adhesive surface of the tape may, optionally, be protected with a temporary, removable release liner (i.e., protective liner) such as a polyolefin (e.g., polyethylene or polypropylene) or polyester (e.g., polyethylene terephthalate) film, or a plastic film. Such films may be treated with a release material such as silicones, waxes, fluorocarbons, and the like. Only after the adhesive composition has been substantially fully cured and crosslinked such that there is substantially no unsaturation are the adhesive tapes of the invention applied to a wafer for processing (grinding and/or dicing).

The invention will be more fully appreciated with reference to the following non-limiting examples. The examples were evaluated with respect to certain test methods which are described below. All dimensions given in the test methods and the examples are nominal dimensions.

Test Methods

Peel Adhesion

Peel adhesion was measured against the polished surface of a standard uncircuitized (i.e., no circuit pattern was present on the surface) industrial silicon metal test wafer having a thickness of about 700 $\mu$m. Adhesion was evaluated, after washing the wafer with isopropanol and allowing it to air dry, by attaching a precut test strip of wafer processing tape measuring about 130 mm by 25 mm to the test surface. This test strip was adhered to the test substrate by rolling it down with two passes of an approximately 2 kilogram rubber-coated roller. The substrate with the wafer processing tape was then either tested immediately or allowed to dwell at 23° C. and 50% relative humidity (RH) for a period of time specified in the examples as "dwell."

Next, the substrate was securely taped down to the adhesion test carriage of a Slip-Peel Tester Model SP-102C-3M90 adhesion tester (IMASS, Inc., Accord, Mass.). The hold down tape (3M Product No. 232 masking tape, the 3M Company, St. Paul, Minn.) was placed over part of the exposed wafer surface on the uncircuitized surface of the wafer opposite that in contact with the carriage and extended beyond the edge of the wafer to contact the carriage. One free end of the wafer processing tape test strip was attached to the adhesion tester's force sensor and the test strip was peeled from the substrate at an angle of 180° and a rate of 30 centimeters/minute for ten seconds. An average peel adhesion value was obtained in grams per linear inch width (gliw, which approximates grams per 25 mm). Four separate measurements were made on the test strip and the values reported are an average of the four measurements. The values reported have been rounded to the nearest whole number.

Tapes used in the grinding process of semiconductor wafers should exhibit some measurable adhesion level. Peel adhesion values should be about 5 gliw to about 500 gliw, and more preferably, about 20 gliw to about 300 gliw, to promote wide acceptance of the wafer processing tapes in the semiconductor wafer manufacturing industry. Preferably, the adhesive composition shows acceptable adhesion build over time; that is, it exhibits a final adhesion value that is still within these ranges.

Semiconductor Wafer Staining

The tendency of wafer processing tapes to cause staining of a semiconductor wafer having an exposed circuit pattern overcoated with polyimide resin on one side was evaluated in the following manner. A semiconductor silicon wafer having, in order, electronic circuitry photolithographed on it and a polyimide passivation layer representative of those used in the manufacture of semiconductor IC chips applied such that the exposed surfaces for bonding were both polyimide and electronic circuitry materials, was wiped clean with isopropanol, dried using pressurized air, and its polyimide coated surface covered with the tape of the invention. The tape was adhered to the silicon wafer by rolling it down with one or two passes of an approximately 2 kilogram rubber-coated roller and the excess trimmed from the edges as described below in the test method "Hand Cuttability-Cutting Debris." The silicon wafer with the wafer processing tape was then allowed to dwell at 23° C. and 50% relative humidity (RH) for 7 days.

A test strip of the wafer processing tape measuring about 130 mm by 50 mm, and centered on the flat of the wafer, was cut after the dwell period specified in the examples by drawing a fixed blade gap razor knife across the surface of the wafer processing tape. Next, a test strip measuring about 120 mm by 25 mm was cut closely adjacent, and parallel, to each side of the 50 mm wide center test strip by drawing a fixed blade gap razor knife across the surface of the wafer processing tape. The taped semiconductor wafer was then evaluated for staining and peelability as described below.

A 50 mm wide by about 25 mm long strip of Nitto BT 315S removal tape (available from Nitto Denko Corp., Osaka, Japan) was attached to the leading edge of the center test strip (i.e., the edge positioned at the flat of the wafer) using hand pressure. The removal tape/center test strip combination was pulled off by hand to expose the polyimide coated surface of the wafer. The entire exposed polyimide coated wafer surface was optically examined under a magnification of at least 128X using a Leica WILD M10 Zoom Stereomicroscope (Leica AG, Heerbrugg, Switzerland) for changes in the optical density of the test surface. Changes in the optical density of the test surface indicates the presence of staining.

Peelability

The peelability of the wafer processing tapes was qualitatively evaluated during the automated removal of test strips during the peel adhesion test and during manual removal of the center and side test strips from wafers prepared as described in the "Semiconductor Wafer Staining" test. A tape was considered peelable if it could be removed from the substrate without breaking or fracturing it, and if there was no adhesive residue visible to the unaided human eye on the substrate. Samples were tested either immediately or after a dwell time.

Hand Cuttability-Cutting Debris

The cutting characteristic of a wafer processing tape, after being applied to the polished, uncircuitized test surface of a silicon semiconductor wafer, was evaluated. It is to be noted that no attempt was made to optimize the cutting conditions described herein. The hand cuttability characteristics reported below are intended to demonstrate the effect of variations in the adhesive composition. The same test wafer was used for all the examples. If there was debris visibly present from the preceding test, it was wiped away using isopropanol and the wafer air dried before applying a tape of the invention. A sample of the wafer processing tape was applied to the test surface such that the tape covered the entire surface and extended beyond its edges. After application, the tape was pressed down onto the wafer surface by hand, and finger pressure applied to the edges to ensure intimate contact along the entire circumference. The substrate with the wafer processing tape on it was tested immediately. The excess tape extending beyond the edges of the test surface was cut away around the entire circumference by hand with a new or used razor blade. The blade was held against the edge of the surface at an angle of about 15° from the-normal direction (i.e, the perpendicular plane of the test surface) and an angle of about 30° from a tangent line along the edge of the test surface during the cutting process.

A rating of single plus (+), double plus (++), or triple plus (+++) was assigned based on the length of the cut edge which was free of visible debris during cutting. Tapes which exhibited no, or only slight, debris were assigned a rating of triple plus (+++) and were deemed useful with either manual or automated methods of cutting. Tapes which exhibited a moderate amount of debris were assigned a rating double plus (++) and were deemed useful with either manual or automated methods of cutting although automated methods are preferred. Tapes which exhibited somewhat greater debris were assigned a rating of single plus (+) and were deemed best used with automated methods of cutting under selected conditions. For each tape evaluated one or two samples were run, using either a new or used razor blade. Where two samples were run an average grade is reported.

Modulus

A Rheometrics Dynamic Analyzer RDAII, Rhesource Series (Rheometric Scientific, Inc., Piscataway, N.J.) was used to measure the storage modulus, G'. A sample having a thickness of about two millimeters was prepared by laying up several layers of the cured adhesive and punching out a disc having a diameter of about 8 mm. Measurements were made in a parallel plate mode, using 8 millimeter diameter plates, at a frequency of 6.28 radians/second and a strain of 0.5%. The temperature was scanned from 0° C. to 40° C. at a rate of 5° C./minute with readings taken every 20 seconds. The storage modulus, G' at 24° C. is reported. These measurements were typically made 3–4 days after the adhesive compositions were prepared.

Semiconductor Wafer Dicing

The specific utility of the wafer processing tapes as wafer dicing tapes was evaluated by stretching a sample of tape, approximately 200 mm square, over a 142 mm inside diameter wafer ring (#8572 from Gustav Wirz AG, Berg, Switzerland) and locking the tape down with the outer lock ring. A piece of polished, uncircuitized silicon wafer, having the approximate dimensions of 51 mm×51 mm and a thickness of 42 mm, was carefully placed on the stretched film to avoid capturing air between the wafer and the film. A 2.2 kg rubber roller was run over the backside of the tape to remove any possible air pockets. Twelve hours after attaching the silicon wafer, it was diced using a Disco Abrasive System, Inc., Mountain View, Calif. automatic dicing saw (Model No. DAD-2H/5 fitted with a Disco NBCZ-2060 saw blade having a 51.4 mm outside diameter and a thickness of 0.050 mm). The dicing saw was run at a rate of 25.4 mm/sec using a water wash of 39 pounds per square inch (psi) to cut the silicon wafer into die measuring either 2.5 mm×2.5 mm or 1.3 mm×2.5 mm on kerf centers. The total number of die cut was about 200 for each size. The number of die washed off the tape during the wafer dicing process was recorded.

Glossary

Various abbreviations are used in the following examples. The abbreviations are defined according to the following schedule.

AA—Acrylic acid (available from BASF, Parsippany, N..J.)
ABP—p-Acryloxy-benzophenone (available from Sartomer Company, Exton, Pa.)
t-BA—t-butyl acrylate (available from Aldrich Chemical Company, Inc., Milwaukee, Wis.)
DAROCUR 1173—a liquid photoinitiator, 2-hydroxy-2-methyl-1-phenyl-propan-1-one (available from Ciba-Geigy Corporation, Hawthorne, N.Y.)
DMA—N,N-dimethyl acrylamide monomer (available from Jarchem Industries, Inc., Newark, N..J.)
HDDA—1,6-hexanediol diacrylate (available from UCB Chemicals Corp., Augustana, S.C.)
HPA—an isometric mixture of 2-hydroxypropyl acrylate and 3-hydroxypropyl acrylate (available as ROCRYL 430 from Rohm and Haas, Philadelphia, Pa.)
IBOA—Isobornyl acrylate (available from San Esters Corporation, New York, N.Y.)
IGEPAL CA-897 —a nonionic, alkylphenol ethoxylated surfactant (available from Rhone-Poulenc, Cranbury, N..J.)
IOA—Isooctyl acrylate
IRGACURE 819—a solid photoinitiator (di(2,4,6-trimethylbenzoyl)phenyl phosphine oxide) (available from Ciba-Geigy Specialty Chemicals Corporation, Tarrytown, N.Y.)
LUCERIN TPO—a solid photoinitiator (available from BASF, Parsippany, N..J.)
2-MBA—2-methylbutyl acrylate
PEOM—methoxy-capped poly(ethylene glycol) 550 monomethacrylate (available as CD 552, nominal molecular weight of 550, from Sartomer Company, Inc., Exton, Pa.)
PET—poly(ethylene glycol terephthalate)
PhOEA—2-(phenoxy)ethyl acrylate (available from CPS Chemical, Old Bridge, N..J.)
PURELAST 566A—acrylated urethane oligomer (available from Polymer Systems, Orlando, Fla.)
TMBA—1,1,3,3-tetramethyl butyl acrylamide (available from National Starch Chemical Co., Bridgewater, Conn.)
TMPTA—trimethylolpropane triacrylate (available from UCB Chemicals Corporation, Augustana, S.C.)
VAZO 64—a thermal initiator, N,N'azo-bis(isobutryonitrile) (available ACROS Organics, Pittsburgh, Pa.)

Unless noted otherwise, in the following examples all amounts are given in grams rounded to the nearest tenth of a gram.

EXAMPLE 1

A wafer processing tape according to the invention was provided in the following manner. A premix syrup was prepared by mixing together in a 0.47 liter glass jar 307.5 grams of 2-methylbutyl acrylate (2-MBA), 3.2 grams of acrylic acid (AA), 6.3 grams of a 25% solution (w/w) of carbon tetrabromide in 2-MBA, and 0.16 gram of DAROCUR 1173 photoinitiator. The jar was capped and a nitrogen source placed into the mixture through a hole in the cap. After purging with nitrogen for ten minutes the mixture was gently swirled and exposed to ultraviolet (UV) irradiation using two 15 Watt blacklight bulbs (Sylvania Model F15T8/350BL) until a syrup having an estimated (visually) viscosity of about 1000 centipoise was obtained. The nitrogen purge and irradiation were then discontinued and 1.88 grams of LUCERIN TPO photoinitiator was added to the premix syrup and dissolved therein by placing the combination, in a sealed jar, on a roller for 30 minutes to give a base syrup. Next, to 35.2 grams of the base syrup in a 0.25 liter glass jar were added 5.4 grams of dimethyl acrylamide (DMA) and 7.7 grams of hexanediol diacrylate (HDDA). These were mixed together by hand for about 2 minutes using a metal spatula. The resulting final syrup had a composition of 2-MBA:AA:DMA:HDDA/72:1:11:16 (weight percent, wt-%).

The final syrup was coated between a 50.0 $\mu$m thick optical grade polyethylene terephthalate (PET) cover film ("optical grade" refers to a film having a haze value of no greater than about 1.8%) (on the bottom) and a 90 $\mu$m thick, corona treated polypropylene backing film (available from American Profol, Inc., Cedar Rapids, Iowa) (on top) using a knife-over-bed coating station. The knife was locked in position to maintain a fixed gap which was set at 38 $\mu$m greater than the combined thickness of the two films employed. The resulting coated composite was then cured by passing it through a 9.1 meter long UV irradiation chamber having bulbs mounted in the top which had a spectral output from 300 nm to 400 nm, with a maximum at 351 nm. There were four general zones within the chamber. In zone 1, which represented about one quarter of the total exposure time, the temperature setpoint was 15.5° C. and the bulbs were set at an intensity of 1.4 milliWatts/centimeter$^2$; in zones 2–4 the temperature setpoint was 32.2° C. and bulb intensity was set at 6.0 milliWatts/centimeter$^2$. The web speed through the coating station and irradiation chamber was 1.5 meters/minute which resulted in a total measured energy dosage of 1800 milliJoules/centimeter$^2$ (National Institute of Standards and Technology (NIST) units) . After irradiation from the top (polypropylene) side, a wafer processing tape having a backing film of polypropylene, a cured, crosslinked adhesive composition of about 38 $\mu$m in thickness, and a PET cover film was obtained. After removal of the PET cover film, the tape was evaluated for adhesion, staining, peelability, and cutting characteristics as described above. The results are presented in Table 1 below.

Test specimens for the evaluation of modulus were prepared as follows. The final syrup composition was coated between a silicon coated PET liner and a urethane release coated PET liner, each about 51 µm thick, using a knife-over-bed coating station with a gap setting of about 254 µm. This sandwich construction was then exposed to UV irradiation using four 15 Watt blacklight bulbs (Sylvania Model F15T8/350BL) for 10 minutes to give a total energy dosage of about 2510 milliJoules/centimeter$^2$. The resulting cured, crosslinked adhesive was used, after removal of the PET liners, to prepare specimens for the evaluation of modulus.

EXAMPLE 2

A wafer processing tape was prepared and evaluated as described in Example 1 with the following modifications. The premix syrup was made using 134.5 grams 2-MBA, 7.1 grams AA, 0.84 gram of a solution of 5% carbon tetrabromide in 2-MBA, and 0.08 gram DAROCUR 1173 photoinitiator. To this premix syrup were added 1.01 grams LUCERIN TPO photoinitiator and 26.6 grams of DMA to give the base syrup. To 55.6 grams of the base syrup was added 5.6 grams of trimethylol propane triacrylate (TMPTA) to provide a final syrup having a composition of 2-MBA:AA:DMA:TMPTA/73:4:14:9 (wt-%). The final syrup was coated and irradiated as described in Example 1 except the web speed was 1.7 meters/minute and the total measured energy dosage was 1531 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 3

A wafer processing tape was prepared and evaluated as described in Example 1 with the following modifications. The premix syrup was made using 106.6 grams 2-MBA, 35.5 grams 1,1,3,3-tetramethyl butyl acrylamide (TMBA, a solid which dissolved in the 2-MBA), and 0.07 gram DAROCUR 1173 photoinitiator. To this premix syrup was added 0.78 gram additional DAROCUR 1173 photoinitiator to give the base syrup. HDDA (6.8 grams) was combined with 45.6 grams of the base syrup to provide a final syrup having a composition of 2-MBA:NOA:HDDA/65:22:13 (wt-%). The final syrup was coated and irradiated as described in Example 1 except the web speed was 1.7 meters/minute and the total measured energy dosage was 1531 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 4

A wafer processing tape was prepared and evaluated as described in Example 1 with the following modifications. The premix syrup was made using 116.9 grams poly(ethylene oxide) mono-methacrylate (PEOM), 0.23 gram of a 25% carbon tetrabromide solution in 2-MBA, and 0.06 gram DAROCUR 1173 photoinitiator. To the premix syrup was added 1.4 grams LUCERIN TPO photoinitiator and 116.9 grams DMA to give the base syrup. HDDA (7.5 grams) was combined with 39.5 grams of the base syrup to provide a final syrup having a composition of PEOM:DMA:HDDA/42:42:16 (wt-%). The final syrup was coated and irradiated as described in Example 1 except the total measured energy dosage was 1769 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 5

A wafer processing tape was prepared and evaluated as described in Example 1 with the following modifications. The premix syrup was made using 48.2 grams 2-MBA, 2.8 grams AA, 0.15 gram of a 25% carbon tetrabromide solution in 2-MBA, and 0.07 gram DAROCUR 1173 photoinitiator. To the premix syrup was added 0.84 gram LUCERIN TPO photoinitiator, 41.3 grams DMA, and 48.2 grams PEOM to give the base syrup. HDDA (6.1 grams) was combined with 31.9 grams of the base syrup to provide a final syrup having a composition of 2-MBA:AA:DMA:PEOM:HDDA/28.5:2:25:28.5:16.0 (wt-%). The final syrup was coated and irradiated as described in Example 1 except the total measured energy dosage was 1769 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 6

A wafer processing tape was prepared and evaluated as described in Example 1 with the following modifications. The premix syrup was made using 76.8 grams hydroxypropyl acrylate (HPA), 0.15 gram of a 25% carbon tetrabromide solution in 2-MBA, and 0.04 gram DAROCUR 1173 photoinitiator. To the premix syrup was added 0.92 gram LUCERIN TPO photoinitiator, 19.2 grams DMA, and 57.6 grams PEOM to give the base syrup. HDDA (9.2 grams) was combined with 45.7 grams of the base syrup to provide a final syrup having a composition of PEOM:HPA:DMA:HDDA/40:10:30:20 (wt-%). The final syrup was coated and irradiated as described in Example 1 except the total measured energy dosage was 1795 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 7

A water processing tape was prepared and evaluated as described in Example 1 with the following modifications. A premix syrup of isooctyl acrylate (IOA) was made using IOA and 0.05% (w/w) DAROCUR 1173 photoinitiator. To 72.8 grams of the premix syrup was added 18.2 grams of phenoxy ethyl acrylate (PhOEA) and an additional 0.55% DAROCUR 1173 (w/w based on the combined weight of premix syrup and PhOEA) to give the base syrup. HDDA (5.9 grams) was combined with 39.0 grams of the base syrup to provide a final syrup having a composition of IOA:PhOEA:HDDA/70:17:13 (wt-%). The final syrup was coated and irradiated as described in Example 1 except the web speed was 1.7 meters/minute and the total measured energy dosage was 1531 milliJoules/centimeter$^2$ (NIST units). A wafer processing tape having a cured, crosslinked adhesive composition thickness of about 38 µm was obtained. The test results on the resulting wafer processing tape are shown in Table 1.

EXAMPLE 8

A wafer processing tape was prepared and evaluated as described in Example 7 with the following modification. HDDA (9.2 grams) was combined with 46.0 grams of the base syrup to provide a final syrup having a composition of IOA:PhOEA:HDDA/66.7:16.7:16.7 (wt-%). The final syrup was coated and irradiated as described in Example 1 except the web speed was 1.7 meters/minute and the total measured energy dosage was 1531 milliJoules/centimeter$^2$ (NIST units). A wafer processing tape having a cured, crosslinked adhesive composition thickness of about 38 μm was obtained. The test results on the resulting wafer processing tape are shown in Table 1.

EXAMPLE 9

A wafer processing tape was prepared and evaluated as described in Example 1 with the following modifications. The premix syrup was made using 113.1 grams IOA, 28.8 grams isobornyl acrylate (IBOA), and 0.07 gram DAROCUR 1173 photoinitiator. To the premix syrup was added 0.78 grams additional DAROCUR 1173 photoinitiator to give the base syrup. HDDA (5.4 grams) was combined with 35.8 grams of the base syrup to provide a final syrup having a composition of IOA:IBOA:HDDA/69:18:13 (wt-%). The final syrup was coated and irradiated as given in Example 1 except the web speed was 1.7 meters/minute and the total measured energy dosage was 1531 milliJoules/centimeter$^2$ (NIST units). A wafer processing tape having a cured, crosslinked adhesive composition thickness of about 38 μm was obtained. The test results on the resulting wafer processing tape are shown in Table 1.

a wafer processing tape having a backing film of PET and a cured, crosslinked adhesive composition of about 70 μm thickness was obtained. The composition of the adhesive was HPA:t-BA:ABP/83:15:2 (wt-%). The tape was evaluated for peel adhesion, peelability, and cutting characteristics as described above with the following modification. A circuitized semiconductor wafer having a polyimide overcoat, such as that described in the test method "Semiconductor Wafer Staining," was employed for all of the testing done. The peel adhesion value reported is an average of six measurements. The results are presented in Table 2 below.

EXAMPLE 11

A wafer processing tape according to the invention was provided by preparing a polymer latex, coating and drying it on a polyester (PET) backing, and exposing the coated polymer to irradiation. More specifically, 86 parts by weight 2-MBA, 10 parts by weight isobornyl acrylate (IBOA), 4 parts by weight of the methacrylamide-functional photo-crosslinker disclosed in U.S. Pat. No. 5,506,279 (Column 5/6, Formula 2), 3% by weight (based on the combined weights of 2-MBA, IBOA, and photocrosslinker) IGEPAL CA 897 nonionic surfactant, and 0.5% by weight (based on

TABLE 1

| Example | Peel Adhesion (gliw) | | Peelable (Yes/No) | Staining (Yes/No) | Hand Cuttability | Modulus (Pascals) |
| --- | --- | --- | --- | --- | --- | --- |
| | 0 Days Dwell | 7 Days Dwell | | | | |
| 1 | 143 | 169 | Yes | No | ++++ | 5.0 × 10$^6$ |
| 2 | 96 | 236 | Yes | No | ++++ | 1.7 × 10$^7$ |
| 3 | 48 | 84 | Yes | No | +++ | 2.8 × 10$^6$ |
| 4 | 51 | 73 | Yes | No | ++++ | 1.3 × 10$^6$ |
| 5 | 31 | 51 | Yes | No | ++ | 1.8 × 10$^6$ |
| 6 | 17 | 31 | Yes | No | ++ | 2.1 × 10$^6$ |
| 7 | 8 | 8 | Yes | No | + | 1.5 × 10$^6$ |
| 8 | 8 | 8 | Yes | No | + | 1.7 × 10$^6$ |
| 9 | 17 | 22 | Yes | No | ++ | 1.7 × 10$^6$ |

EXAMPLE 10

A wafer processing tape according to the invention was provided by preparing a solution polymer, coating and drying it on a polyester (PET) backing, and exposing the coated polymer to irradiation. More specifically, 85 parts by weight HPA, 15 parts by weight t-butyl acrylate (t-BA), 2% by weight (based on the combined weight of HPA and t-BA) p-acryloxy benzophenone (ABP) photocrosslinker, 0.35% by weight (based on the combined weight of HPA, t-BA and ABP) of VAZO 64 thermal initiator and ethyl acetate were charged into a bottle to give a 25% solids composition. The bottle was capped and rotated in a water bath at 60° C. for 24 hours. After allowing the mixture to cool to room temperature, the resulting polymer solution was poured onto a 50.0 μm thick optical grade PET film backing and pulled through a knife-over-bed coating station by hand. The gap between knife and bed was set to be 254 μm greater than the thickness of the backing. The coated film was dried at room temperature for about 10 minutes followed by about 4 minutes in a forced air oven set at 82° C. This coated and dried film was then passed through a nitrogen inerted irradiation chamber, having a length of about 2.4 meters and equipped with two medium pressure mercury bulbs, at a speed of about 4.8 meters/minute. A total measured energy dosage of about 625 milliJoules/centimeter$^2$ (NIST units) was applied to the exposed polymer side. Upon irradiation the combined weights of 2-MBA, IBOA and photoinitiator) of dilauryl peroxide, and 104 grams of deionized water were combined in a 1 liter homogenizing mixer (Waring Blender 700, Waring Company, New Hartford, Conn.), purged with nitrogen at a rate of 1 liter/minute for three minutes and then homogenized at high speed for 2 minutes. The resulting mixture was transferred to a 2 liter flask fitted with an agitator, a condenser and a thermocouple, and stirred at speed of 300 revolutions/minute (rpm) while heating to 60° C. Stirring was continued throughout the preparation described below. The mixture was maintained at 60° C. until an exotherm to 82° C. occurred, at which time the external heat source was removed and the mixture allowed to cool to 60° C. The external heat source was reapplied and the temperature maintained at 60° C. for one hour, after which the external heat source was removed and the mixture allowed to cool to about room temperature. After filtering the cooled mixture (no coagulum was observed) a polymer latex having a measured solids level of 49% was obtained.

The polymer latex was poured onto a 50.0 μm thick optical grade PET film backing and pulled through a knife-over-bed coating station by hand. The gap between knife and bed was set to be between about 76 μm and 101 μm greater than the thickness of the backing. The coated film was dried about 4 minutes in a forced air oven set at 93° C. After drying, the exposed polymer surface was covered with a 50.0 μm thick optical grade PET release liner film having a silicone-urea release agent on one side (as described in U.S. Pat. No. 5,290,615 (Tushaus et al.)) in order to protect the adhesive coating until it was irradiated. The release treated side was placed facing inward so that it was in contact with the polymer. Upon removal of the release liner the uncrosslinked adhesive on the PET backing was passed through a nitrogen inerted irradiation chamber, having a length of about 2.4 meters and equipped with three medium pressure mercury bulbs, at a speed of about 18.3 meters/minute. A total measured energy dosage of 631 milliJoules/centimeter$^2$ (NIST units) was applied from the exposed adhesive side. After irradiation the release liner was reapplied to the now crosslinked adhesive surface as before to give a wafer processing tape having a backing film of PET, a cured, crosslinked adhesive composition thickness of about 87 μm, and a PET release liner. The composition of the adhesive was 2-MBA:IBOA:Photocrosslinker/86:10:4 (wt-%). The tape was evaluated as described for Example 10 with the following modification. The reported peel adhesion values are an average of two test measurements. The results are presented in Table 2 below.

EXAMPLE 12

A wafer processing tape according to the invention was provided by preparing a polymer latex as described in Example 11 with the following changes. Specifically, 80.5 parts by weight 2-MBA, 17 parts by weight IBOA, and 2.5 parts by weight of the methacrylamide-functional photocrosslinker described in Example 11 were employed to give an adhesive composition of 2-MBA:IBOA:Photocrosslinker/80:17:3 (wt-%). The resulting tape, which had a cured, crosslinked adhesive composition (irradiated according to the description of Example 11) thickness of about 85 μm, was evaluated as described for Example 11. The results are presented in Table 2 below.

TABLE 2

| | Peel Adhesion (gliw) | | | |
|---|---|---|---|---|
| Example | 0 Days Dwell | 7 Days Dwell | Peelable (Yes/No) | Hand Cuttability |
| 10 | N.T. | 12 | Yes | ++++ |
| 11 | 114 | 111 | Yes | ++ |
| 12 | 261 | 250 | Yes | ++ |

N.T. = Not Tested
*Dwell = 2.5 Days

EXAMPLE 13

A wafer processing tape was prepared in a manner similar to that described in Example 1 with the following modifications. The premix syrup was made using 178.1 grams 2-MBA, 9.4 grams AA, 0.94 gram of a solution of 5% carbon tetrabromide in 2-MBA, and 0.09 gram DAROCUR 1173 photoinitiator. To the premix syrup were added 40.1 grams of HDDA and 35.2 grams of DMA to give the base syrup. To 44.0 grams of the base syrup was added 0.26 gram of IRGACURE 819 to provide a final syrup having a composition of 2-MBA:AA:DMA:HDDA/68:4:13:15 (wt-%). The final syrup was knife-coated between a 101.6 μm thick ethylene/vinyl acetate film (obtained from Dai Nippon Jushi, Chiba, Japan) on top and a 50.0 μm thick optical grade PET cover film on the bottom, and irradiated from the top side as described in Example 1 except the web speed was 1.5 meters/minute and the total measured energy dosage was 1816 milliJoules/centimeter$^2$ (NIST units). A wafer processing tape having a cured, crosslinked adhesive composition thickness of about 58 μm was obtained. After removal of the PET cover film, the tape was evaluated for use in a wafer dicing process as described in the "Semiconductor Wafer Dicing" test method above. The die loss results are reported in Table 3 below.

TABLE 3

| Example | Die Dimensions (mm) | Die Loss |
|---|---|---|
| 13a | 2.5 × 2.5 | -0- |
| 13b | 1.3 × 2.5 | -0- |

Comparative Example 1

A wafer processing tape was prepared in a manner similar to that described in Example 1 with the following modifications. The premix syrup was made in a 0.24 liter glass jar using 20.0 grams IOA, 5.3 grams IBOA, and 0.01 gram IRGACURE 651 photoinitiator. To the premix syrup were added 1.1 grams of HDDA, 1.3 grams of PURELAST 566A acrylated urethane oligomer and an additional 0.05 grams of IRGACURE 651 photoinitiator to give the clear, final syrup. If the acrylated urethane oligomer is added to the premix at an earlier stage, gelation can occur as a result of impurities. This final syrup had a composition of IOA:IBOA:HDDA:566A/72.1:19.2:3.9:4.8 (w/w).

The final syrup was knife-coated between a 50.0 μm thick optical grade PET film on the bottom and a 50.0 μm thick optical grade PET release liner film having a silicone-urea release agent on one side (as described in U.S. Pat. No. 5,290,615 (Tushaus et al.)) on the top, and irradiated from the top side as given in Example 1 with the following modifications. The web speed was 1.68 meters/minute, all four zones were set at a bulb intensity of 6.0 milliWatts/centimeter$^2$, the zone temperatures were 32° C. and the total measured energy dosage was 1845 milliJoules/centimeter$^2$ (NIST units). A wafer processing tape having a cured, crosslinked adhesive composition thickness of about 100 μm was obtained. After removal of the PET cover film, the tape was evaluated for cuttability and peelability. The results are shown in Table 4 below.

In addition, after removal of the PET cover film, the tendency of the wafer processing tape to cause staining of a semiconductor wafer having an exposed circuit pattern overcoated with polyimide resin on one side was evaluated after grinding of the taped wafer. Specifically, the utility of the wafer processing tapes in wafer grinding applications was evaluated with a sample of tape having a width at least equal to the width of a semiconductor silicon wafer. The tape was applied in a class 1000 clean room at ambient temperature to the side of a silicon wafer having a circuit pattern overcoated with polyimide using one pass of an approximately 2 kg rubber-coated roller and the excess tape trimmed off. Next, the wafer with tape attached thereto was allowed to dwell at ambient conditions for no more than eight hours, and usually less than one hour.

The taped semiconductor wafer was then placed with the taped side down onto a Disco Model DFG-83W6 wafer grinder. The wafer was held in place on a rotating platter by a vacuum chuck. During the grinding process the rotating platter passed under a series of three grinding wheels (each available from Disco Corp.). The first grinding wheel (Model No. RS-O1-2-40/60-NA-A) removed 120 μm of silicon, the second grinding wheel (Model No. RS-01-2-20/

30-NA-C) removed 100 μm of silicon, and third grinding wheel (Model No. RS-03-2-2/34-P) removed 10 μm of silicon. A platter rotation speed of about 10 minutes/revolution was employed. Following the third grinding wheel, the semiconductor wafer was washed with water to remove grinding debris, air dried, and allowed to dwell at ambient conditions for about 16 hours, after which it was evaluated for staining as described in the "Semiconductor Wafer Staining" test method above. The results are shown in Table 4 below.

EXAMPLE 14

A wafer processing tape according to the invention having the same composition as Example 1 was provided in the following manner. A final syrup of syrup having a composition of 2-MBA:AA:DMA:HDDA/72:1:11:16 (w/w) was prepared and then die coated between a 50.0 μm thick optical grade polyethylene terephthalate (PET) cover film on top and a 90 μm thick, corona treated polypropylene backing film (available from American Profol, Inc., Cedar Rapids, Iowa) on the bottom. The resulting coated composite was then cured by passing it through a 11.9 meter long UV irradiation chamber having bulbs mounted on the top and bottom which had a spectral output from 300 to 400 nm, with a maximum at 351 nm. There were seven general zones within the chamber. In zones 1 and 2, which represented about 17% of the total exposure time, the temperature setpoint was 15.5° C. and the bulbs gave an average intensity of 1.2 milliWatts/centimeter$^2$; in zones 2–7 the temperature setpoint was 32.2° C. and the average bulb intensity was about 5.3 milliWatts/centimeter$^2$. The web speed through the coating station and irradiation chamber was 2.4 meters/minute which resulted in a total measured energy dosage of about 2480 milliJoules/centimeter$^2$ (NIST) units. After irradiation from both sides simultaneously, a wafer processing tape having a backing film of polypropylene, a cured, crosslinked adhesive composition of about 38 μm in thickness, and a PET cover film was obtained.

After removal of the PET cover film, the tape was evaluated for peelability, and cutting characteristics as described above. In addition, the tendency of the wafer processing tape to cause staining after grinding of the taped wafer was evaluated as described in Comparative Example 1 except the third grinding wheel was not employed and the dwell time before examination for staining was 7 days. The results are presented in Table 4 below.

TABLE 4

| Example | Peelable (Yes/No) | Staining (Yes/No) | Cuttability |
|---|---|---|---|
| 14 | Yes | No | +++ |
| C.E. 1 | Yes | Yes | +++ |

Each of the patents, patent applications, and publications cited herein are incorporated herein by reference, as if individually incorporated. Various modifications and alterations of this invention will become apparent to those skilled in the art without departing from the scope and spirit of the invention. It should be understood that this invention is not limited to the illustrative embodiments set forth herein.

What is claimed is:

1. A method of processing a semiconductor wafer, the method comprising the steps of:
    (a) providing a semiconductor wafer;
    (b) adhesively bonding the semiconductor wafer to an adhesive surface of a semiconductor wafer processing tape comprising a permanent backing and a layer of a nonpressure sensitive adhesive on the permanent backing, the adhesive comprising a copolymer comprising at least one copolymerized acrylic or methacrylic acid ester of a non-tertiary alkyl alcohol having a homopolymer glass transition temperature of no greater than about 10° C., in which the alkyl group contains about 4 to about 14 carbon atoms on average, at least one copolymerized reinforcing monofunctional acrylic monomer having a homopolymer glass transition temperature of at least 10° C., and at least one copolymerized nonionic photocrosslinking agent;
    (c) processing the semiconductor wafer by either grinding the backside of the wafer or dicing the wafer into integrated circuit semiconductor chips; and
    (d) removing the tape without a substantial change in optical density of the wafer.

2. The method according to claim 1 which does not include heating or irradiating the tape prior to removing it from the wafer.

3. A method of processing a semiconductor wafer, the method comprising the steps of:
    (a) providing a semiconductor wafer;
    (b) adhesively bonding the semiconductor wafer to an adhesive surface of a semiconductor wafer processing tape comprising a permanent backing and a layer of a nonpressure sensitive adhesive on the permanent backing, the adhesive comprising a copolymer comprising at least one copolymerized acrylic or methacrylic acid ester of a non-tertiary alkyl alcohol having a homopolymer glass transition temperature of no greater than about 0° C., in which the alkyl group contains about 4 to about 14 carbon atoms on average, at least one copolymerized reinforcing monofunctional acrylic monomer having a homopolymer glass transition temperature of at least about 10° C., and at least one copolymerized nonionic photocrosslinking agent selected from the group of an acrylic crosslinking monomer, an olefinically unsaturated compound, which, in the excited state, is capable of abstracting hydrogen, and mixtures thereof;
    (c) processing the semiconductor wafer by either grinding the backside of the wafer or dicing the wafer into integrated circuit semiconductor chips; and
    (d) removing the tape without a substantial change in optical density of the wafer.

4. The method according to claim 3 which does not include heating or irradiating the tape prior to removing it from the wafer.

5. A method of processing a semiconductor wafer, the method comprising the steps of:
    (a) providing a semiconductor wafer;
    (b) adhesively bonding the semiconductor wafer to an adhesive surface of a semiconductor wafer processing tape comprising a permanent backing and a layer of a nonpressure sensitive adhesive on the permanent backing, the adhesive comprising a copolymer comprising at least one copolymerized acrylic or methacrylic acid ester of a non-tertiary alkyl alcohol having a homopolymer glass transition temperature of no greater than about 0° C., in which the alkyl group contains about 4 to about 14 carbon atoms on average, at least one copolymerized reinforcing monofunctional acrylic monomer having a homopolymer glass transition temperature of at least about 10° C., and at least one copolymerized nonionic photocrosslinking agent with the proviso that the photocrosslinking agent is not a urethane acrylate;

(c) processing the semiconductor wafer by either grinding the backside of the wafer or dicing the wafer into integrated circuit semiconductor chips; and
(d) removing the tape without a substantial change in optical density of the wafer.

6. The method according to claim 5 which does not include heating or irradiating the tape prior to removing it from the wafer.

* * * * *

UNITED STATES PATENT AND TRADEMARK OFFICE
CERTIFICATE OF CORRECTION

PATENT NO. : 6,478,918 B2
DATED : November 12, 2002
INVENTOR(S) : Bennett, Richard E.

It is certified that error appears in the above-identified patent and that said Letters Patent is hereby corrected as shown below:

Title page,
Item [56], FOREIGN PATENT DOCUMENTS,
"JP 6239622" should read -- JP 63296222 --

Column 11,
Line 38, "Rehrner et al." should read -- Rehmer et al. --

Column 26,
Line 7, "10°" should read -- 0° --

Signed and Sealed this

Twentieth Day of May, 2003

JAMES E. ROGAN
*Director of the United States Patent and Trademark Office*